(12) United States Patent
Pu et al.

(10) Patent No.: US 12,334,452 B2
(45) Date of Patent: Jun. 17, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chao-Chiang Pu, Taichung (TW); Chi-Ching Ho, Taichung (TW); Yi-Min Fu, Taichung (TW); Yu-Po Wang, Taichung (TW); Fang-Lin Tsai, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 499 days.

(21) Appl. No.: 17/950,914

(22) Filed: Sep. 22, 2022

(65) Prior Publication Data

US 2024/0038685 A1    Feb. 1, 2024

(30) Foreign Application Priority Data

Jul. 26, 2022   (TW) .................................. 111127968

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4817* (2013.01); *H01L 23/49816* (2013.01); *H01L 23/49822* (2013.01); *H01L 23/49833* (2013.01); *H01L 23/49838* (2013.01); *H01L 23/5381* (2013.01); *H01L 23/5385* (2013.01); *H01L 23/5386* (2013.01); *H01L 24/16* (2013.01); *H01L 24/32* (2013.01); *H01L 24/73* (2013.01);
(Continued)

(58) Field of Classification Search
CPC ............. H01L 23/562; H01L 23/49816; H01L 23/49822; H01L 23/49833; H01L 23/49838; H01L 23/5381; H01L 23/5385; H01L 23/5386; H01L 21/4817; H01L 24/16; H01L 24/32; H01L 24/73; H01L 25/105; H01L 2224/16227; H01L 2224/16235; H01L 2224/16238; H01L 2224/32225; H01L 2224/73204; H01L 2924/3511; H01L 2924/37001
See application file for complete search history.

(56) References Cited

U.S. PATENT DOCUMENTS

2014/0262475 A1* 9/2014 Liu .................... H01L 21/4817
                                                174/377
2014/0367160 A1* 12/2014 Yu ....................... H01L 21/7684
                                                174/377
2019/0051612 A1* 2/2019 Kim ...................... H01L 23/367

* cited by examiner

*Primary Examiner* — Peniel M Gumedzoe
(74) *Attorney, Agent, or Firm* — Studebaker Brackett PLLC

(57) ABSTRACT

An electronic package is provided and includes an electronic structure and a plurality of conductive pillars embedded in a cladding layer, a circuit structure formed on the cladding layer, and a reinforcing member bonded to a side surface of the cladding layer, where a plurality of electronic elements are disposed on and electrically connected to the circuit structure, such that the electronic structure electrically bridges any two of the electronic elements via the circuit structure, so as to enhance the structural strength of the electronic package and avoid warpage by means of the design of the reinforcing member.

20 Claims, 10 Drawing Sheets

(51) Int. Cl.
*H01L 23/498* (2006.01)
*H01L 23/538* (2006.01)
*H01L 25/10* (2006.01)

(52) U.S. Cl.
CPC .. *H01L 25/105* (2013.01); *H01L 2224/16227* (2013.01); *H01L 2224/16235* (2013.01); *H01L 2224/16238* (2013.01); *H01L 2224/32225* (2013.01); *H01L 2224/73204* (2013.01); *H01L 2924/3511* (2013.01); *H01L 2924/37001* (2013.01)

ELECTRONIC PACKAGE AND MANUFACTURING METHOD THEREOF

BACKGROUND

1. Technical Field

The present disclosure relates to a semiconductor device, and more particularly, to an electronic package with a bridge die and a manufacturing method thereof.

2. Description of Related Art

With the vigorous development of the electronic industry, electronic products are also gradually moving towards the trend of multi-function and high performance. Meanwhile, the technologies currently applied in the field of chip packaging include, for example, Chip Scale Package (CSP), Direct Chip Attached (DCA) or Multi-Chip Module (MCM) and other flip-chip packaging modules, etc.

FIG. 1 is a schematic cross-sectional view of a conventional semiconductor package 1. The semiconductor package 1 includes: a cladding layer 15, a bridge chip 10 (which has a plurality of electrode pads 100) and a plurality of conductive pillars 13 embedded in the cladding layer 15, a first routing structure 11 disposed on an upper side 15a of the cladding layer 15 and electrically connected to the bridge chip 10 and the plurality of conductive pillars 13, a plurality of electronic elements 16 disposed on the first routing structure 11, a package layer 18 for covering the plurality of electronic elements 16, a second routing structure 12 disposed on a lower side 15b of the cladding layer 15 and electrically connected to the plurality of conductive pillars 13, and a plurality of conductive elements 17 disposed on the second routing structure 12 and electrically connected to the second routing structure 12.

The first routing structure 11 includes a plurality of insulating layers 110, a plurality of routing layers 111 disposed on the plurality of insulating layers 110, and a plurality of conductive blind vias 112 electrically connected to the routing layers 111, so that the plurality of conductive blind vias 112 are electrically connected to the plurality of conductive pillars 13 and the plurality of routing layers 111, and the outermost routing layer 111 has a plurality of electrical contact pads 113 of micro pad (μ-pad) specification.

The electronic element 16 is a functional chip, which has a plurality of electrode pads 160 bonded with conductive bumps 161 such as micro bump (μ-bump) specifications, so that the electronic element 16 is soldered on the electrical contact pads 113 with the conductive bumps 161 by a flip-chip method, and then the conductive bumps 161 are covered with an underfill 162.

However, in the conventional semiconductor package 1, as the functional requirements of the product increase greatly, the functional requirements of the electronic element 16 also increase accordingly, so the circuit layout area of the first routing structure 11 and the second routing structure 12 increases accordingly. In this case, the width of the overall layout increases, resulting in extremely weak structural strength, which is easily affected by high temperature and causes warpage, thereby causing the routing layers 111 or the circuits of the second routing structure 12 to be broken.

Therefore, how to overcome the above-mentioned drawbacks of the prior art has become an urgent issue to be solved at present.

SUMMARY

In view of the various deficiencies of the prior art, the present disclosure provides an electronic package, comprising: a cladding layer having a first surface and a second surface opposing the first surface; an electronic structure embedded in the cladding layer; a plurality of conductive pillars embedded in the cladding layer; at least one reinforcing member bonded to the cladding layer; a circuit structure formed on the first surface of the cladding layer and electrically connected to the plurality of conductive pillars and the electronic structure, wherein the circuit structure is free from being electrically connected to the reinforcing member; and a plurality of electronic elements disposed on and electrically connected to the circuit structure, wherein the electronic structure acts as a bridge die to electrically bridge at least two of the plurality of electronic elements via the circuit structure.

The present disclosure also provides a method of manufacturing an electronic package, comprising: forming a plurality of conductive pillars on a carrier and disposing at least one reinforcing member and an electronic structure on the carrier; forming a cladding layer on the carrier, wherein the cladding layer covers the plurality of conductive pillars, the reinforcing member and the electronic structure; forming a circuit structure on the cladding layer, wherein the circuit structure is electrically connected to the plurality of conductive pillars and the electronic structure and is free from being electrically connected to the reinforcing member; disposing a plurality of electronic elements on the circuit structure, wherein the plurality of electronic elements are electrically connected to the circuit structure, such that the electronic structure acts as a bridge die to electrically bridge at least two of the plurality of electronic elements via the circuit structure; and removing the carrier.

In the aforementioned electronic package and the manufacturing method thereof, the reinforcing member is a metal frame or a frame made of non-metallic material.

In the aforementioned electronic package and the manufacturing method thereof, the reinforcing member has a width of at least 35 micrometers.

In the aforementioned electronic package and the manufacturing method thereof, the reinforcing member has a width greater than or equal to a width of each of the conductive pillars.

In the aforementioned electronic package and the manufacturing method thereof, the reinforcing member is annular.

In the aforementioned electronic package and the manufacturing method thereof, the reinforcing member surrounds the electronic structure.

In the aforementioned electronic package and the manufacturing method thereof, the reinforcing member has at least one guide hole.

In the aforementioned electronic package and the manufacturing method thereof, the electronic structure is defined with a horizontal center line to divide the cladding layer into a first area and a second area opposing the first area, such that a number of the conductive pillars in the first area is greater than a number of the conductive pillars in the second area, and a width of the reinforcing member corresponding to the second area is greater than a width of the reinforcing member corresponding to the first area.

In the aforementioned electronic package and the manufacturing method thereof, the present disclosure further comprises forming a plurality of conductive elements on the cladding layer, wherein the plurality of conductive elements are electrically connected to the plurality of conductive pillars and are free from being electrically connected to the reinforcing member.

As can be seen from the above, the electronic package of the present disclosure and the manufacturing method thereof are designed to enhance the structural strength of the electronic package by means of the design of the reinforcing member. Therefore, compared with the prior art, the present disclosure can effectively avoid the warping problem of the electronic package.

BRIEF DESCRIPTION OF THE DRAWINGS

FIG. 2A, FIG. 2B-1, FIG. 2C-1, FIG. 2D, FIG. 2E, FIG. 2F, FIG. 2G and FIG. 2H-1 are schematic cross-sectional views illustrating a manufacturing method of an electronic package according to the present disclosure.

FIG. 2B-2 is a schematic partial top view of FIG. 2B-1.

FIG. 2C-2 is a schematic partial top view of FIG. 2C-1.

FIG. 2H-2 is a schematic cross-sectional view of another aspect of FIG. 2H-1.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one," "a," "an" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A, FIG. 2B-1, FIG. 2C-1, FIG. 2D, FIG. 2E, FIG. 2F, FIG. 2G and FIG. 2H-1 are schematic cross-sectional views illustrating a manufacturing method of an electronic package 2 according to the present disclosure.

Figure 2A:
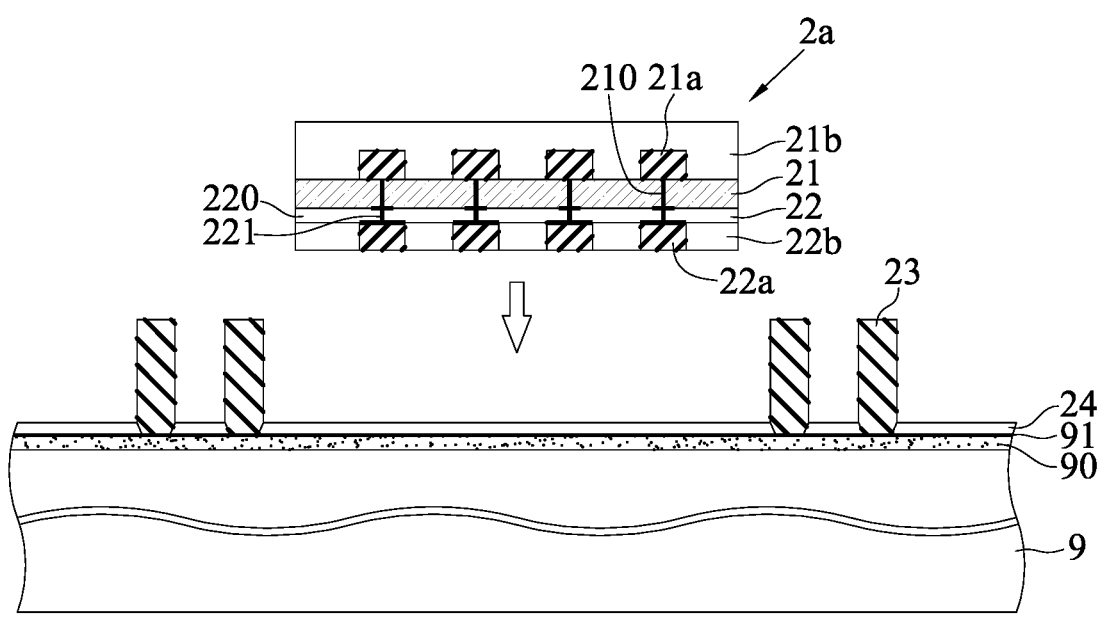

As shown in FIG. 2A, an electronic structure 2a and a carrier 9 having an insulating layer 24 disposed thereon are provided, and a plurality of conductive pillars 23 are formed on the carrier 9.

In an embodiment, the carrier 9 is, for example, a plate of semiconductor material (such as silicon or glass), on which a release layer 90 and a metal layer 91 such as titanium/copper are sequentially formed by, for example, coating, so that the insulating layer 24 is formed on the metal layer 91. For example, the material for forming the insulating layer 24 is a dielectric material such as polybenzoxazole (PBO), polyimide (PI), prepreg (PP), or other dielectric materials.

Furthermore, the material for forming the plurality of conductive pillars 23 is a metal material such as copper or a solder material, and the plurality of conductive pillars 23 extend through the insulating layer 24 to contact the metal layer 91. For example, by exposure and development, a plurality of openings exposing the metal layer 91 are formed on the insulating layer 24, so that the plurality of conductive pillars 23 are formed by electroplating the metal layer 91 from the openings.

The electronic structure 2a includes an electronic body 21, a circuit portion 22, a plurality of first conductors 21a formed on the electronic body 21, and a plurality of second conductors 22a formed on the circuit portion 22 and electrically connected to the circuit portion 22. Next, a first protective layer 21b is formed on the electronic body 21 so that the first protective layer 21b covers the plurality of first conductors 21a, and a second protective layer 22b is formed on the circuit portion 22 so that the second protective layer 22b covers the plurality of second conductors 22a.

In an embodiment, the electronic body 21 is a silicon substrate, such as a semiconductor chip, which has a plurality of conductive vias 210 such as conductive through-silicon vias (TSVs) penetrating through the electronic body 21, so as to electrically connect the circuit portion 22 and the plurality of first conductors 21a. For example, the circuit portion 22 includes at least one passivation layer 220 and conductive traces 221 bonded with the passivation layer 220, so that the conductive traces 221 are electrically connected to the conductive vias 210 and the plurality of second conductors 22a. It should be understood that the structure of the element having the conductive vias 210 has various aspects and the present disclosure is not limited to as such.

Furthermore, the first conductors 21a and the second conductors 22a are metal pillars such as copper pillars, and the first protective layer 21b is an insulating film or a polyimide (PI) material, so that the first conductors 21a are not exposed, and the second protective layer 22b is a non-conductive film (NCF) or other materials that are easy to adhere to the insulating layer 24. For example, the second conductors 22a are first formed on the circuit portion 22 of the electronic structure 2a, and then the non-conductive film (the second protective layer 22b) is adhered. It should be understood that the second protective layer 22b may not be formed in the electronic structure 2a, and a conventional dispensing (i.e., underfill) process can be used in the subsequent process (in the process shown in FIG. 2B-1), but the second conductors 22a adopt the configuration specifications of small pitch, low height and high density, which are not conducive to the capillary flow of the conventional underfill. Therefore, it is preferable to select a non-conductive film as the second protective layer 22b.

Figure 1:
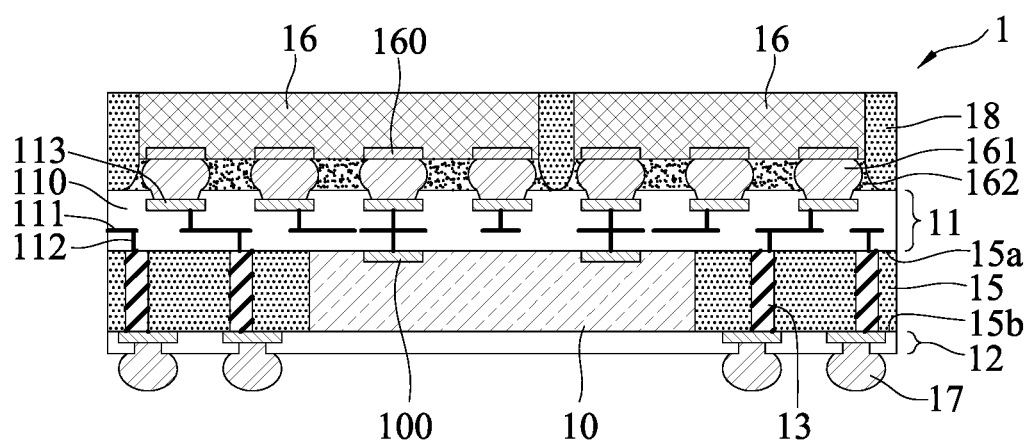
FIG. 1 is a schematic cross-sectional view of a conventional semiconductor package.
Figures 1, 2B:
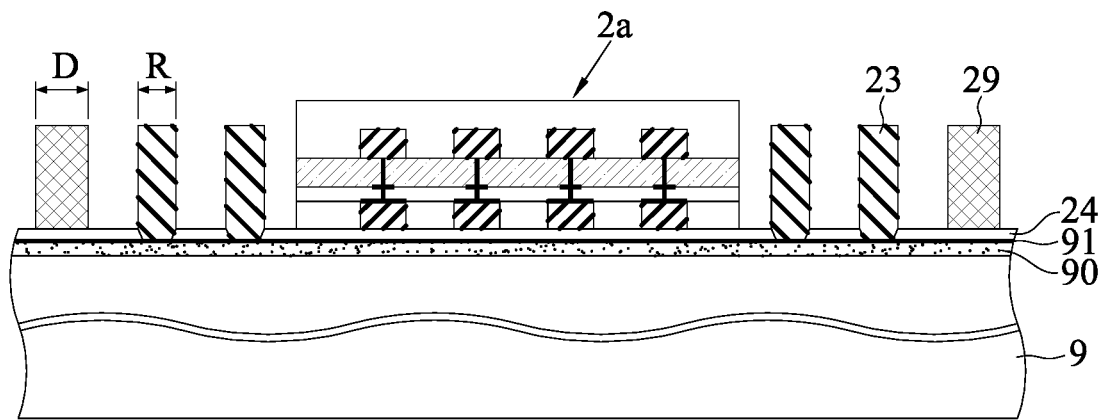

As shown in FIG. 2B-1, the electronic structure 2a and the second protective layer 22b thereon are bonded onto the insulating layer 24, and at least one reinforcing member 29 is disposed on the insulating layer 24.

Figures 2, 2B:
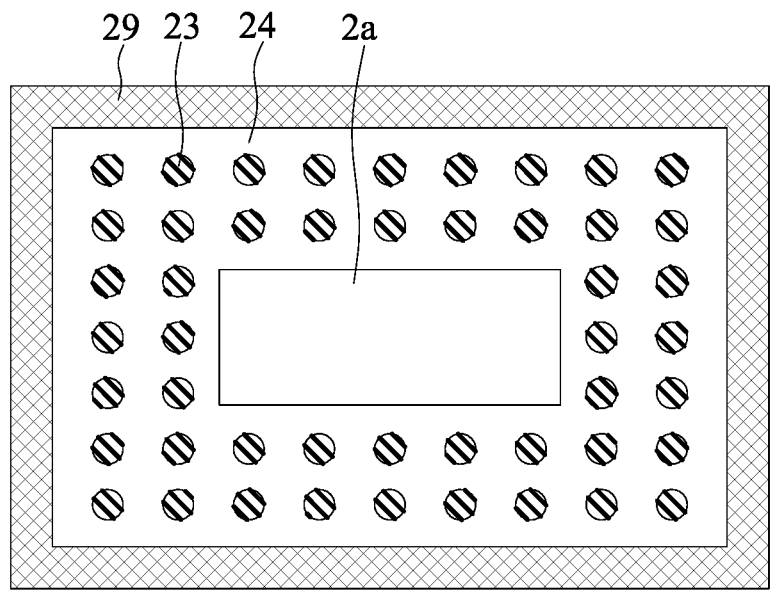

In an embodiment, the reinforcing member 29 is a metal frame or a non-metal frame, which is fixed on the insulating layer 24 by sticking or other methods. For example, the reinforcing member 29 is annular, as shown in FIG. 2B-2, so as to surround the electronic structure 2a and the conductive pillars 23.

Furthermore, a width D of the reinforcing member 29 is at least 35 micrometers (μm), and the width D of the reinforcing member 29 is greater than a width R of the conductive pillar 23. Without affecting the layout of the conductive pillar 23, the thicker the reinforcing member 29, the better.

Figure 4A:
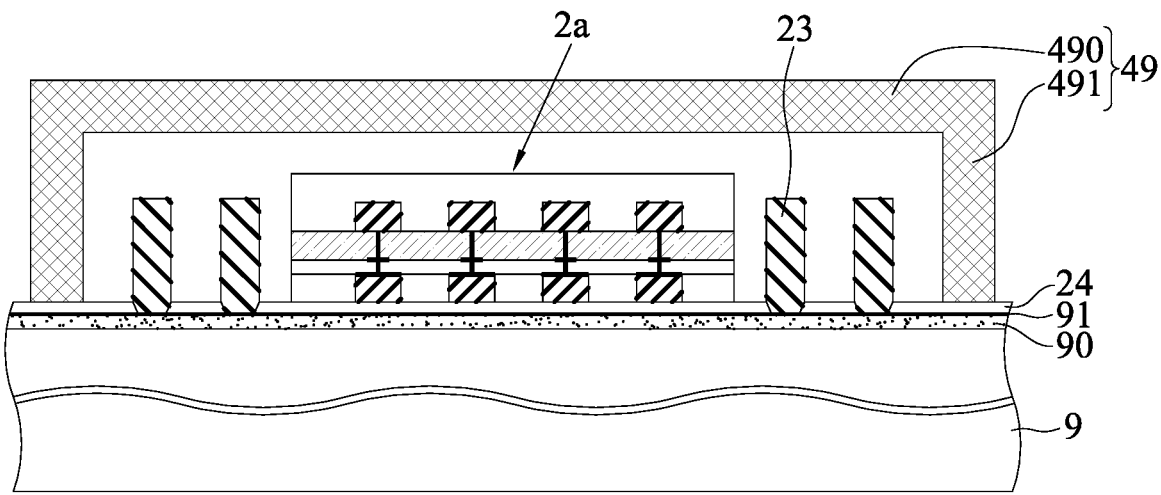
FIG. 4A is a schematic cross-sectional view of another embodiment of the process of FIG. 2B-1.
Figure 4B:
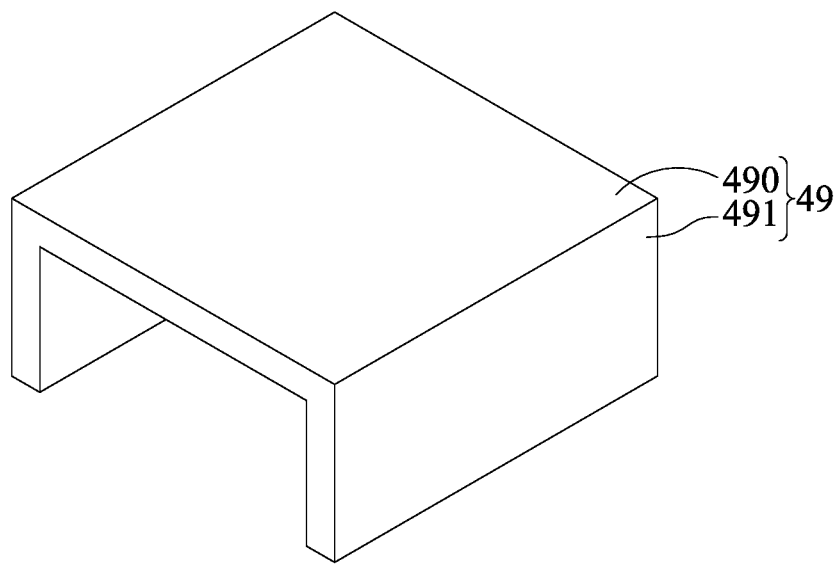
FIG. 4B is a schematic partial perspective view of FIG. 4A.
Figure 4C:
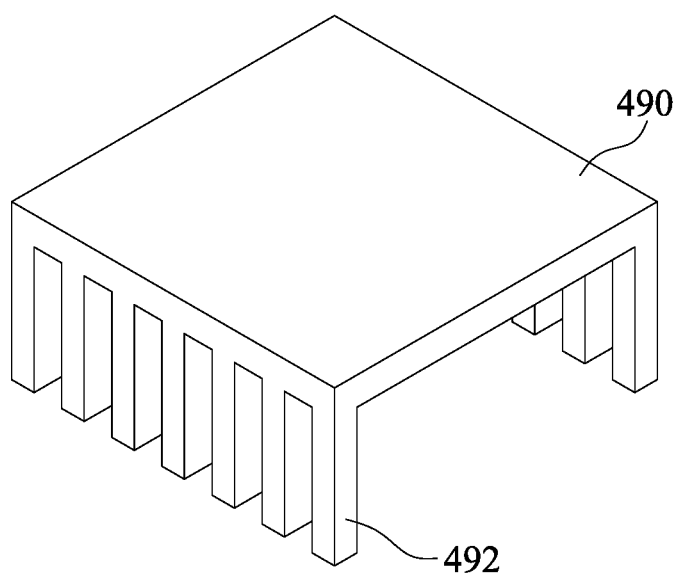
FIG. 4C is a schematic plan view of another aspect of FIG. 4B.
Figure 4D:
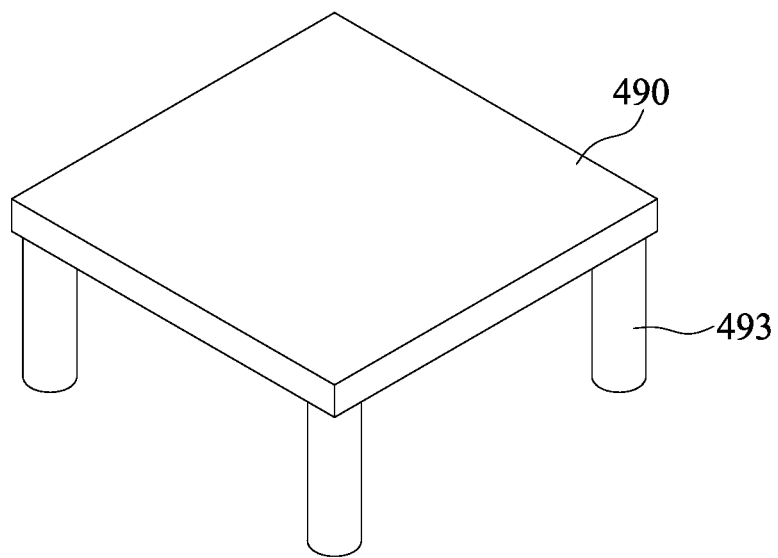
FIG. 4D is a schematic perspective view of another aspect of FIG. 4B.

Please also refer to FIG. 4A, in other embodiments, a reinforcing member 491 can also be a part of a mask structure 49 and is disposed on a cover body 490, so that the reinforcing member 491 is erected (e.g., vertically disposed) on the insulating layer 24, such that the cover body 490 covers the electronic structure 2a and the conductive pillars 23. For example, the cover body 490 can be in the shape of a rectangular sheet, and the reinforcing member 491 can be in the shape of a wall (as shown in FIG. 4B), in the shape of a grid (e.g., a reinforcing member 492 as shown in FIG. 4C), or in the shape of a column (as shown in FIG. 4D, reinforcing members 493 are provided at the corners of the cover body 490).

Therefore, there are various aspects of the reinforcing member 29, 491, 492, 493, and the present disclosure is not limited to as such.

Figures 1, 2C:
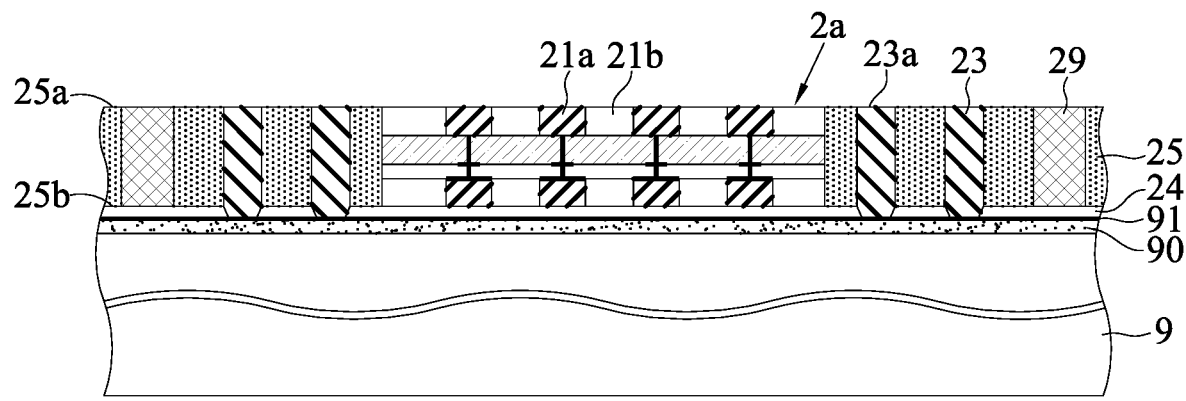
Figures 2, 2C:
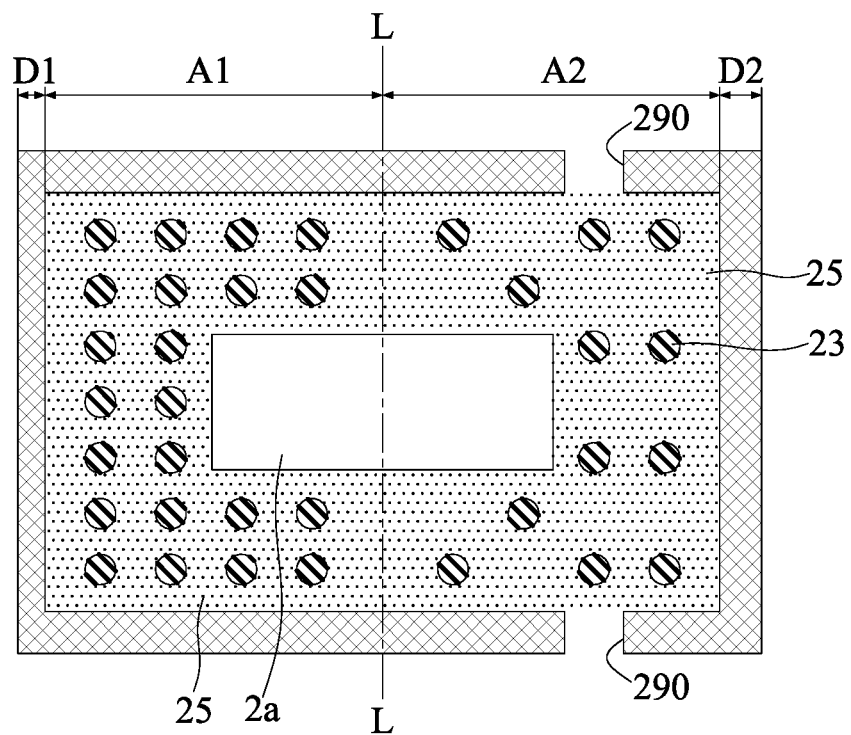

As shown in FIG. 2C-1, following the process of FIG. 2B-1, a cladding layer 25 is formed on the insulating layer 24, so that the cladding layer 25 covers the electronic structure 2a, the reinforcing member 29 and the conductive pillars 23, wherein the cladding layer 25 has a first surface 25a and a second surface 25b opposing the first surface 25a, so that the first protective layer 21b, end surfaces of the first conductors 21a and end surfaces 23a of the conductive pillars 23 are exposed from the first surface 25a of the cladding layer 25, and the cladding layer 25 is bonded onto the insulating layer 24 with the second surface 25b thereof.

In an embodiment, the cladding layer 25 is an insulating material, such as polyimide (PI), dry film, encapsulating colloid such as epoxy resin, or molding compound. For example, the cladding layer 25 can be formed on the insulating layer 24 by liquid compound, injection, lamination, or compression molding.

Furthermore, the first surface 25a of the cladding layer 25 can be flushed with the first protective layer 21b, the reinforcing member 29, the end surfaces 23a of the conductive pillars 23 and the end surfaces of the first conductors 21a via a leveling process, so that the reinforcing member 29, the end surfaces 23a of the conductive pillars 23 and the end surfaces of the first conductors 21a are exposed from the first surface 25a of the cladding layer 25. For example, by a grinding method, the leveling process removes partial materials of the reinforcing member 29, partial materials of the first protective layer 21b, partial materials of the conductive pillar 23, partial materials of the first conductor 21a and partial materials of the cladding layer 25. It should be understood that, if the process of FIG. 4A is continued, the cover body 490 can be removed by grinding via the leveling process, so as to present the aspect shown in FIG. 2C-1, so that the reinforcing members 491, 492, 493 (like the reinforcing member 29 shown in FIG. 2C-1) are flush with and exposed from the first surface 25a of the cladding layer 25.

Also, as shown in FIG. 2C-2, the electronic structure 2a is defined with a horizontal center line L, so as to divide the cladding layer 25 into a first area A1 and a second area A2 opposite to each other, so that when the number of the conductive pillars 23 in the first area A1 is greater than the number of the conductive pillars 23 in the second area A2, a width D2 of the reinforcing member 29 corresponding to the second area A2 is greater than a width D1 of the reinforcing member 29 corresponding to the first area A1, so as to balance volume of copper in the first area A1 and the second area A2.

In addition, the reinforcing member 29 may have at least one guide hole 290 for the cladding layer 25 to flow into the reinforcing member 29 through the guide hole 290 to cover the electronic structure 2a and the conductive pillars 23. For example, the reinforcing member 29 is configured with a plurality of guide holes 290 to form a discontinuous ring, so as to facilitate the flow of the adhesive material of the cladding layer 25. Further, the position of the guide hole 290 is deviated from the horizontal center line L of the electronic structure 2a, so as to avoid the problem that the adhesive material of the cladding layer 25 directly collides with the electronic structure 2a and causes the electronic structure 2a to be broken.

Figure 2D:
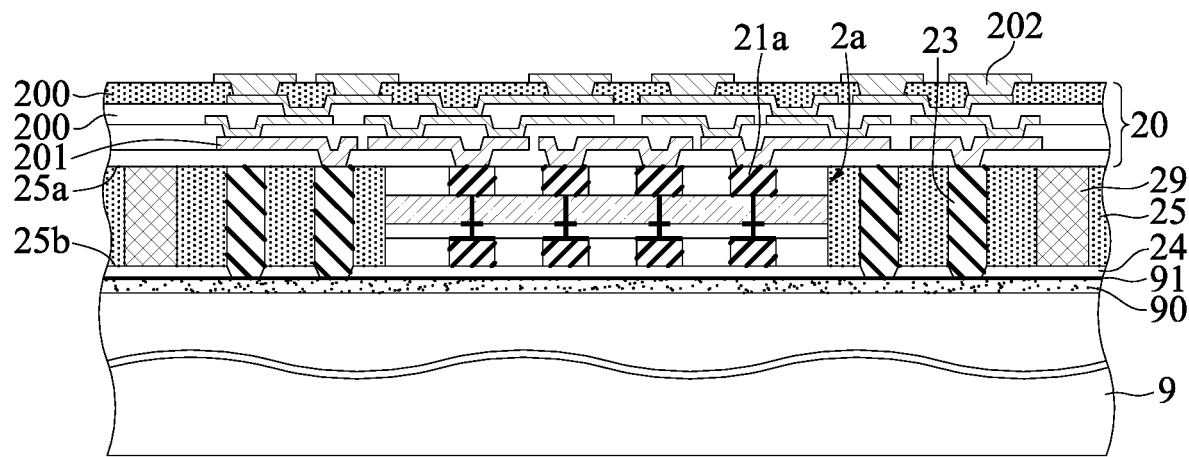

As shown in FIG. 2D, a circuit structure 20 is formed on the first surface 25a of the cladding layer 25, so that the circuit structure 20 is electrically connected to the plurality of conductive pillars 23 and the plurality of first conductors 21a, and the circuit structure 20 is free from being electrically connected to the reinforcing member 29.

In an embodiment, the circuit structure 20 includes at least one insulating layer 200 and at least one redistribution layer (RDL) 201 disposed on the insulating layer 200, wherein the outermost insulating layer 200 can be used as a solder mask layer, and the outermost redistribution layer 201 is exposed from the solder mask layer to serve as electrical contact pads 202, such as micro pads (commonly known as μ-pads).

Furthermore, the material for forming the redistribution layer 201 is copper, and the material for forming the insulating layer 200 is a dielectric material such as polybenzoxazole (PBO), polyimide (PI), prepreg (PP) and the like, or a solder-proof material such as solder mask, ink (e.g., graphite) and the like.

Figure 2E:
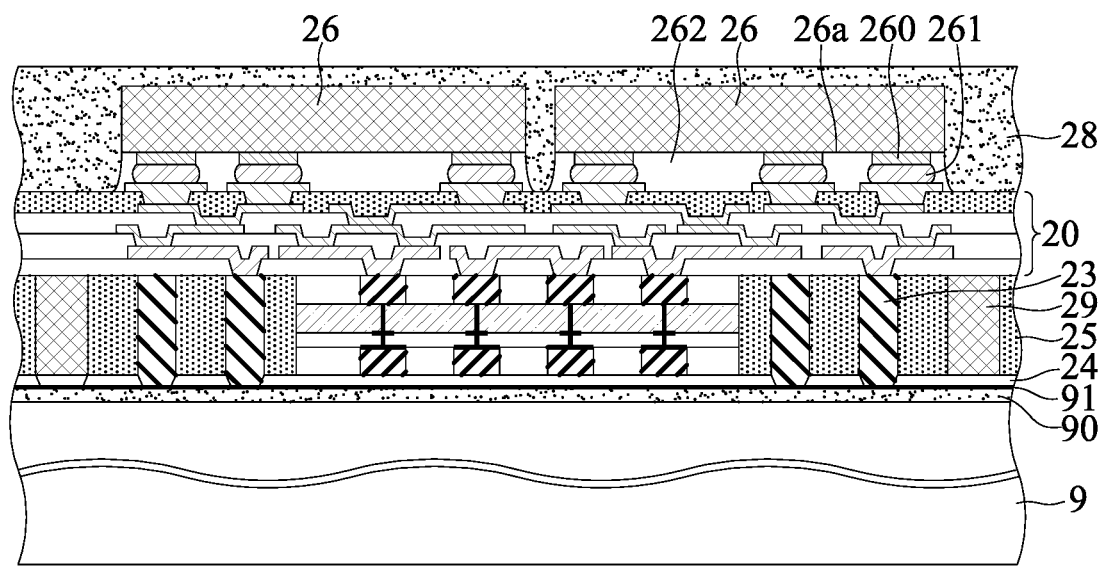

As shown in FIG. 2E, a plurality of electronic elements 26 are disposed on the circuit structure 20, and then a package layer 28 is used to cover the electronic elements 26.

In an embodiment, the electronic element 26 is an active element, a passive element, or a combination of the active element and the passive element, where the active element is such as a semiconductor chip, and the passive element is such as a resistor, a capacitor, or an inductor. In one embodiment, the electronic element 26 is, for example, a semiconductor chip such as a graphics processing unit (GPU), a high bandwidth memory (HBM), etc., and the present disclosure is not limited to as such. Further, the electronic structure 2a is used as a bridge element (e.g., a bridge die), which is electrically connected to the circuit structure 20 via the first conductors 21a to electrically bridge at least two electronic elements 26.

Furthermore, an active surface 26a of the electronic element 26 has a plurality of electrode pads 260 to electrically connect the electrical contact pads 202 via a plurality of conductive bumps 261 containing solder material, and the package layer 28 can cover the electronic elements 26 and the conductive bumps 261 at the same time. In an embodiment, an under bump metallurgy (UBM) layer (not shown)

may be formed on the electrical contact pads 202 to facilitate bonding with the conductive bumps 261.

In addition, the package layer 28 is an insulating material, such as polyimide (PI), dry film, encapsulating colloid such as epoxy resin, or molding compound, which can be formed on the circuit structure 20 by lamination or molding. It should be understood that the material for forming the package layer 28 can be the same as or different from the material for forming the cladding layer 25.

In addition, an underfill 262 can also be first formed between the electronic element 26 and the circuit structure 20 to cover the conductive bumps 261, and then the package layer 28 can be formed to cover the underfill 262 and the electronic element 26.

Figure 2F:
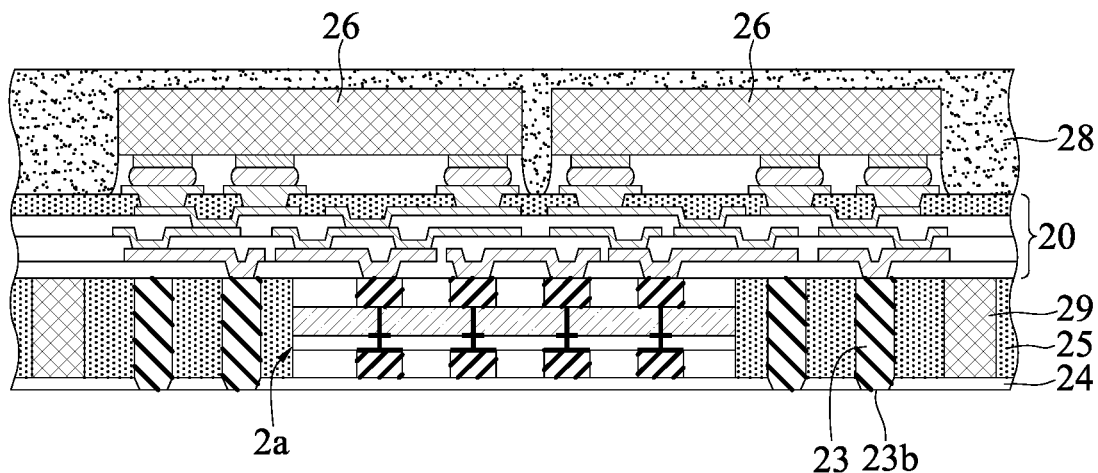

As shown in FIG. 2F, the carrier 9 and the release layer 90 thereon are removed, and then the metal layer 91 is removed to expose the insulating layer 24 and the other end surfaces 23b of the conductive pillars 23.

In an embodiment, when the release layer 90 is peeled off, the metal layer 91 is used as a barrier to avoid damage to the insulating layer 24, and after removing the carrier 9 and the release layer 90 thereon, the metal layer 91 is removed by etching. At this time, the conductive pillars 23 are exposed from the insulating layer 24, and the electronic structure 2a and the reinforcing member 29 are free from being exposed from the insulating layer 24.

Figure 2G:
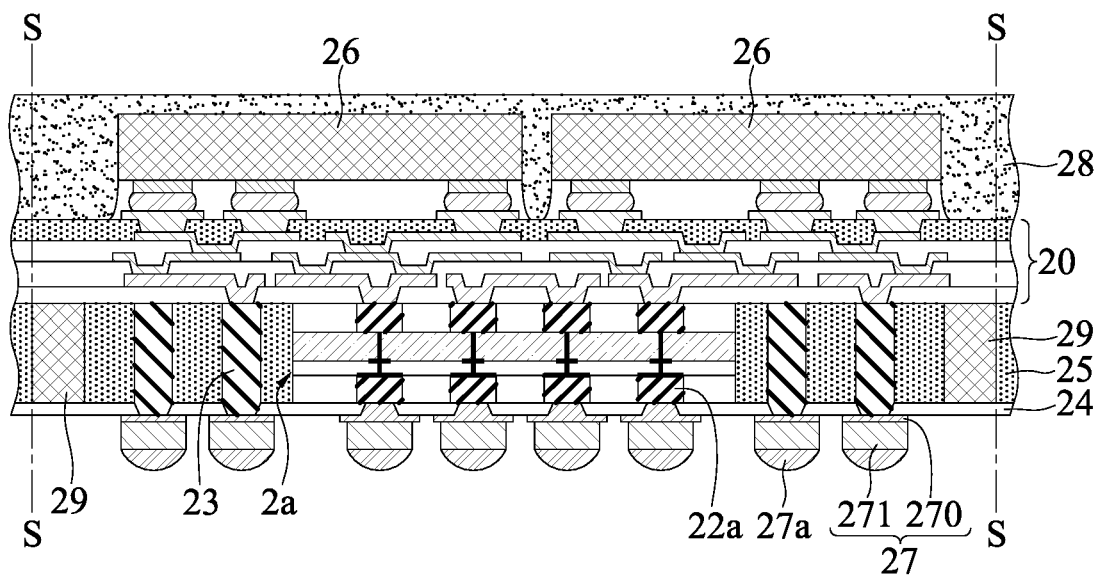

As shown in FIG. 2G, a plurality of conductive elements 27 are formed on the insulating layer 24, and the conductive elements 27 are electrically connected to the plurality of conductive pillars 23 and the plurality of second conductors 22a.

In an embodiment, an opening process is performed on the insulating layer 24, so that the second conductors 22a are exposed from the insulating layer 24 for bonding the plurality of conductive elements 27. For example, a plurality of openings are formed on the insulating layer 24 by a laser method, so that the second conductors 22a are exposed from the openings, such that the plurality of conductive elements 27 are formed in the plurality of openings to electrically connect the second conductors 22a, wherein each of the conductive elements 27 includes a metal body (such as UBM or circuit) 270 and a copper pillar 271 bonded to the metal body 270 to form a solder material 27a such as a solder bump or a solder ball on the end surface of the copper pillar 271.

It should be understood that, when the number of contacts (e.g., input/output or I/O) is insufficient (e.g., if the number of the conductive elements 27 can no longer meet the product requirements), a build-up operation can still be performed on the insulating layer 24 by the RDL process.

Figures 1, 2H:
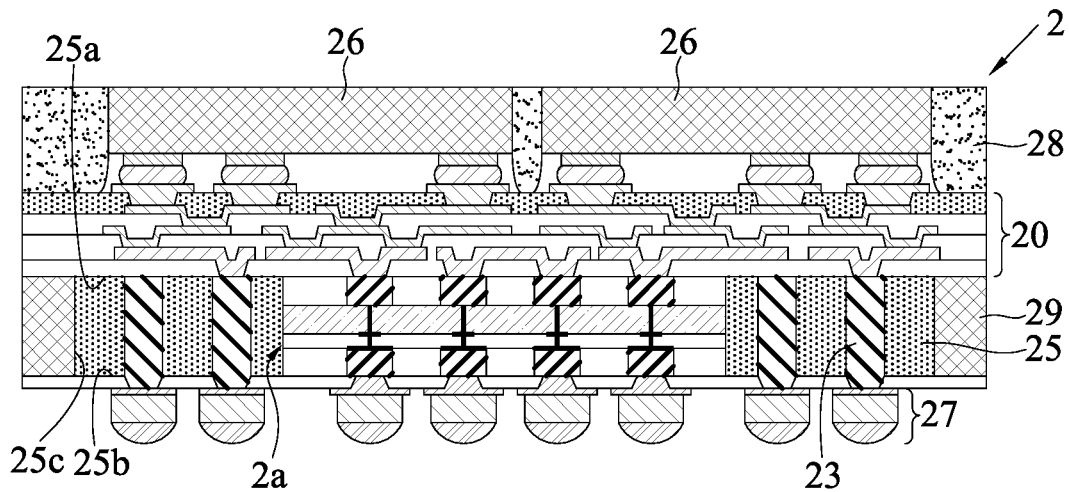
Figures 2, 2H:
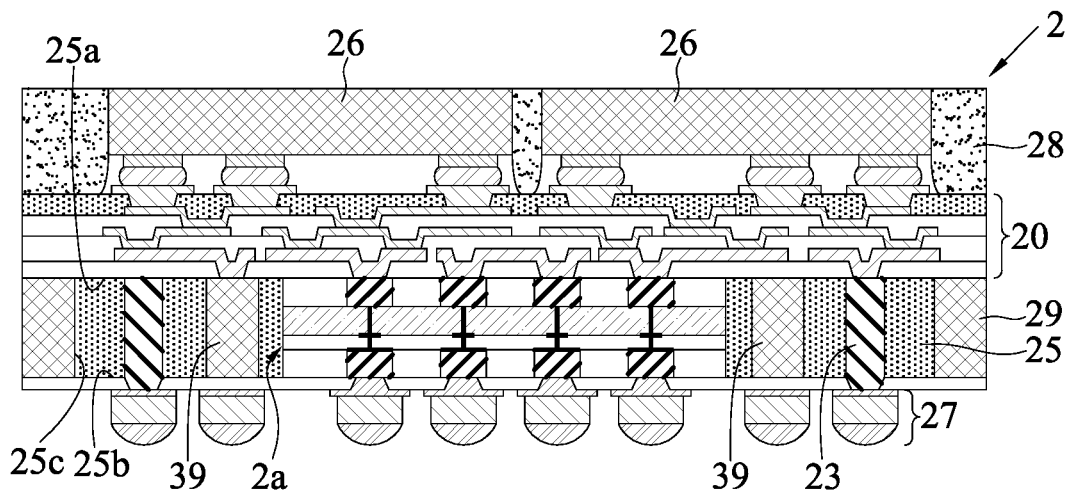

As shown in FIG. 2H-1, a singulation process is performed along a cutting path S shown in FIG. 2G to obtain a plurality of electronic packages 2, wherein the reinforcing member 29 is located on the cutting path S. Therefore, after the singulation process, the cladding layer 25 will be formed with a plurality of side surfaces 25c adjacent to the first surface 25a and the second surface 25b, and the reinforcing member 29 is disposed on the side surface 25c of the cladding layer 25 and is exposed from the cladding layer 25.

In an embodiment, a leveling process, such as grinding, can be used to remove partial materials of the package layer 28, so that the upper surface of the package layer 28 is flush with the upper surface of the electronic element 26, such that the electronic element 26 is exposed from the package layer 28.

Furthermore, the reinforcing member 29 can be arranged at any position on the insulating layer 24 according to requirements. For example, as shown in FIG. 2H-2, at least one reinforcing member 39 is disposed between the conductive pillar 23 and the electronic structure 2a and embedded in the cladding layer 25.

Figure 3:
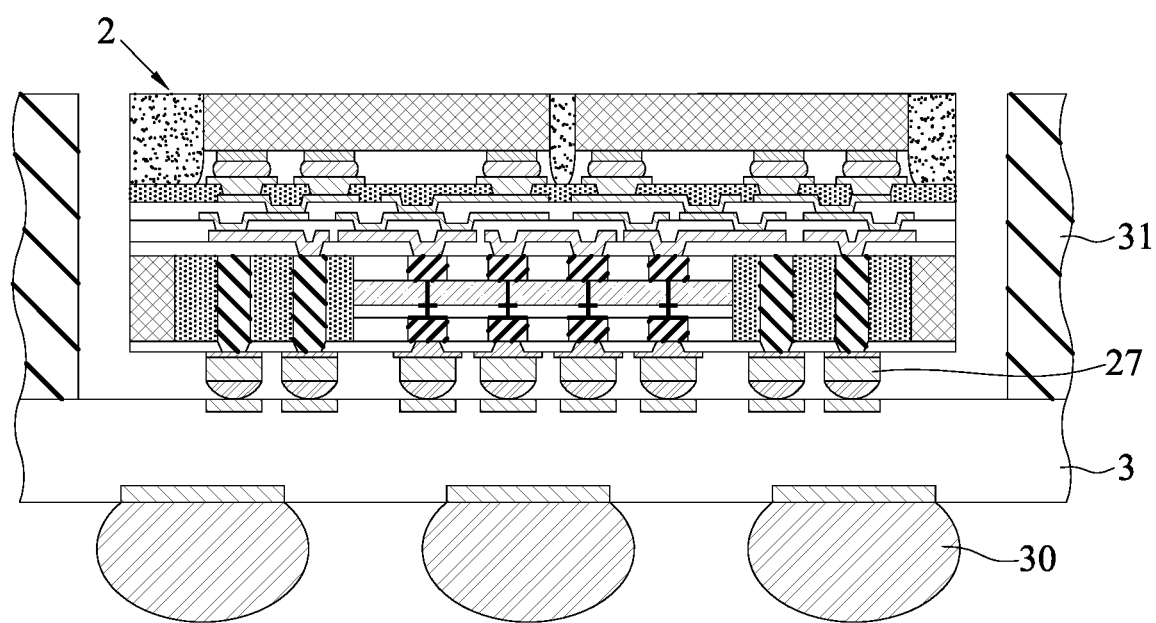
FIG. 3 is a schematic cross-sectional view of the subsequent process of FIG. 2H-1.

Also, in the subsequent process, the electronic package 2 can be disposed on a package substrate 3 via the conductive elements 27, as shown in FIG. 3, and a ball-placement process is performed on the underside of the package substrate 3 to form a plurality of solder balls 30 for the package substrate 3 to be disposed on a circuit board (not shown) with the plurality of solder balls 30.

In addition, the package substrate 3 can be provided with a functional member 31 (such as a metal frame) according to requirements, so as to eliminate the problem of stress concentration and prevent the package substrate 3 from warping.

Therefore, in the manufacturing method of the present disclosure, the reinforcing members 29, 39 are disposed on the insulating layer 24 before the cladding layer 25 is formed, so as to enhance the structural strength of the electronic package 2 during the manufacturing process. Therefore, compared with the prior art, the present disclosure can effectively avoid the problem of warpage of the electronic package 2 before and after the manufacturing process.

Furthermore, the electronic structure 2a is used as a bridge element (e.g., a bridge die) to directly electrically conduct at least two active chips (electronic elements 26) above, so as to shorten the electrical path, and the pitch between the contacts (I/O) or the electrical contact pads 202 can be effectively reduced according to requirements, and the number of layers of the redistribution layer 201 for electrical connection between the upper and lower layers of the circuit structure 20 can also be reduced to increase the process yield.

In addition, the electronic structure 2a has conductive vias 210, so that part of the electrical path (such as power) can be directly transmitted up and down through the electronic structure 2a to the required place (such as the package substrate 3 or the electronic element 26), so as to shorten the electrical path and improve the electrical performance.

The present disclosure also provides an electronic package 2, which comprises: a cladding layer 25, an electronic structure 2a, a plurality of conductive pillars 23, at least one reinforcing member 29, 39, a circuit structure 20 and a plurality of electronic elements 26.

The cladding layer 25 has a first surface 25a and a second surface 25b opposing the first surface 25a.

The electronic structure 2a is embedded in the cladding layer 25.

The conductive pillars 23 are embedded in the cladding layer 25.

The reinforcing members 29, 39 are bonded to the cladding layer 25.

The circuit structure 20 is formed on the first surface 25a of the cladding layer 25 and is electrically connected to the plurality of conductive pillars 23 and the electronic structure 2a, and the circuit structure 20 is free from being electrically connected to the reinforcing members 29, 39.

The electronic elements 26 are disposed on the circuit structure 20 and are electrically connected to the circuit structure 20, so that the electronic structure 2a is used as a bridge die, such that the bridge die electrically bridges at least two of the plurality of electronic elements 26 via the circuit structure 20.

In one embodiment, the reinforcing members 29, 39 are metal frames or non-metal frames.

In one embodiment, widths D, D1, D2 of the reinforcing members 29, 39 are at least 35 micrometers.

In one embodiment, the widths D, D1, D2 of the reinforcing members 29, 39 are greater than or equal to a width R of each of the conductive pillars 23.

In one embodiment, the reinforcing members 29, 39 are annular.

In one embodiment, the reinforcing members 29, 39 surround the electronic structure 2a.

In one embodiment, the reinforcing members 29, 39 have at least one guide hole 290.

In one embodiment, the electronic structure 2a is defined with a horizontal center line L, so that the cladding layer 25 is divided into a first area A1 and a second area A2 opposite to each other, so that the number of the conductive pillars 23 in the first area A1 defined by the horizontal center line L is greater than the number of the conductive pillars 23 in the second area A2 defined by the horizontal center line L, such that the width D2 of the reinforcing member 29 corresponding to the second area A2 divided by the horizontal center line L is greater than the width D1 of the reinforcing member 29 corresponding to the first area A1 divided by the horizontal center line L.

In one embodiment, the electronic package 2 further includes a plurality of conductive elements 27 disposed on the second surface 25b of the cladding layer 25, where the plurality of conductive elements 27 are electrically connected to the plurality of conductive pillars 23 and are free from being electrically connected to the reinforcing members 29, 39.

To sum up, the electronic package of the present disclosure and the manufacturing method thereof are designed to enhance the structural strength of the electronic package by means of the design of the reinforcing member. Therefore, the present disclosure can effectively avoid the warping problem of the electronic package.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a cladding layer having a first surface and a second surface opposing the first surface;
   an electronic structure embedded in the cladding layer;
   a plurality of conductive pillars embedded in the cladding layer;
   at least one reinforcing member bonded to the cladding layer;
   a circuit structure formed on the first surface of the cladding layer and electrically connected to the plurality of conductive pillars and the electronic structure, wherein the circuit structure is free from being electrically connected to the reinforcing member; and
   a plurality of electronic elements disposed on and electrically connected to the circuit structure, wherein the electronic structure acts as a bridge element to electrically bridge at least two of the plurality of electronic elements via the circuit structure.

2. The electronic package of claim 1, wherein the reinforcing member is a metal frame.

3. The electronic package of claim 1, wherein the reinforcing member is a frame made of non-metallic material.

4. The electronic package of claim 1, wherein the reinforcing member has a width of at least 35 micrometers.

5. The electronic package of claim 1, wherein the reinforcing member has a width greater than or equal to a width of each of the conductive pillars.

6. The electronic package of claim 1, wherein the reinforcing member is annular.

7. The electronic package of claim 1, wherein the reinforcing member surrounds the electronic structure.

8. The electronic package of claim 1, wherein the reinforcing member has at least one guide hole.

9. The electronic package of claim 1, wherein the electronic structure is defined with a horizontal center line to divide the cladding layer into a first area and a second area opposing the first area, such that a number of the conductive pillars in the first area is greater than a number of the conductive pillars in the second area, and a width of the reinforcing member corresponding to the second area is greater than a width of the reinforcing member corresponding to the first area.

10. The electronic package of claim 1, further comprising a plurality of conductive elements disposed on the second surface of the cladding layer, wherein the plurality of conductive elements are electrically connected to the plurality of conductive pillars and are free from being electrically connected to the reinforcing member.

11. A method of manufacturing an electronic package, comprising:
    forming a plurality of conductive pillars on a carrier and disposing at least one reinforcing member and an electronic structure on the carrier;
    forming a cladding layer on the carrier, wherein the cladding layer covers the plurality of conductive pillars, the reinforcing member and the electronic structure;
    forming a circuit structure on the cladding layer, wherein the circuit structure is electrically connected to the plurality of conductive pillars and the electronic structure and is free from being electrically connected to the reinforcing member;
    disposing a plurality of electronic elements on the circuit structure, wherein the plurality of electronic elements are electrically connected to the circuit structure, such that the electronic structure acts as a bridge element to electrically bridge at least two of the plurality of electronic elements via the circuit structure; and
    removing the carrier.

12. The method of claim 11, wherein the reinforcing member is a metal frame.

13. The method of claim 11, wherein the reinforcing member is a frame made of non-metallic material.

14. The method of claim 11, wherein the reinforcing member has a width of at least 35 micrometers.

15. The method of claim 11, wherein the reinforcing member has a width greater than or equal to a width of each of the conductive pillars.

16. The method of claim 11, wherein the reinforcing member is annular.

17. The method of claim 11, wherein the reinforcing member surrounds the electronic structure.

18. The method of claim 11, wherein the reinforcing member has at least one guide hole.

19. The method of claim 11, wherein the electronic structure is defined with a horizontal center line to divide the cladding layer into a first area and a second area opposing the first area, such that a number of the conductive pillars in the first area is greater than a number of the conductive pillars in the second area, and a width of the reinforcing member corresponding to the second area is greater than a width of the reinforcing member corresponding to the first area.

20. The method of claim 11, further comprising forming a plurality of conductive elements on the cladding layer, wherein the plurality of conductive elements are electrically connected to the plurality of conductive pillars and are free from being electrically connected to the reinforcing member.

* * * * *